United States Patent [19]

Haeda et al.

[11] Patent Number: 4,915,770

[45] Date of Patent: Apr. 10, 1990

[54] ELECTRONIC CHIP SUPPLYING APPARATUS AND METHOD

[75] Inventors: Yoshio Haeda, Yaizu; Masato Itagaki; Keisuke Fujishiro, both of Shimizu, all of Japan

[73] Assignee: Hitachi, Ltd., Tokyo, Japan

[21] Appl. No.: 190,660

[22] Filed: May 5, 1988

[30] Foreign Application Priority Data

May 9, 1987 [JP] Japan .................................. 62-112846

[51] Int. Cl.⁴ .......................... B65B 69/00; B65H 5/28
[52] U.S. Cl. ....................................... 156/344; 29/740;
156/495; 156/497; 156/584; 221/71; 221/87
[58] Field of Search ............... 156/584, 497, 494, 495,
156/344; 29/740; 221/71, 74, 87, 25

[56] References Cited

U.S. PATENT DOCUMENTS

| | | | |
|---|---|---|---|
| 2,276,980 | 3/1942 | Jacobi | 156/495 |
| 3,230,123 | 1/1966 | Christensen | 156/584 |
| 4,025,382 | 5/1977 | Del Rosso | 156/497 |
| 4,264,400 | 4/1981 | Breitmar | 156/497 |
| 4,327,482 | 5/1982 | Araki et al. | 29/740 |
| 4,468,930 | 3/1987 | La Mers | 156/495 |
| 4,494,902 | 1/1985 | Kuppens et al. | 221/74 |
| 4,740,136 | 4/1988 | Asai et al. | 29/740 |

FOREIGN PATENT DOCUMENTS 57-148875 9/1982 Japan .
60-24100 2/1985 Japan .

Primary Examiner—Michael Wityshyn
Attorney, Agent, or Firm—Antonelli, Terry & Wands

[57] ABSTRACT

In an electronic chip supplying apparatus, a vacuum suction device for sucking a retainer tape which encases electronic chips is provided in a retainer tape support member provided at an opening position where the electronic chips are picked up from a chip pickup device, or a tension applying device for the retainer is provided. Thus, vertical fluctuation of the retainer tape is prevented at the opening position.

6 Claims, 4 Drawing Sheets

FIG. 7
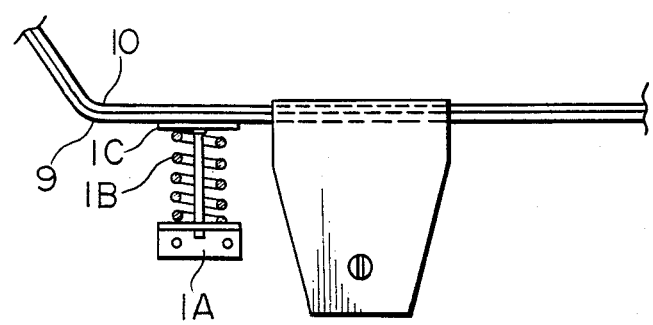
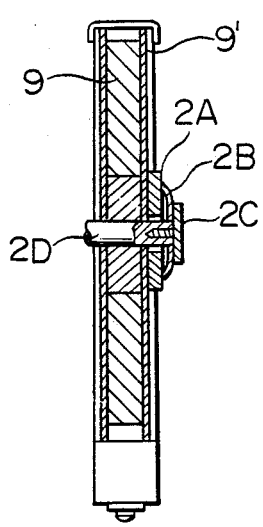
FIG. 8(a)
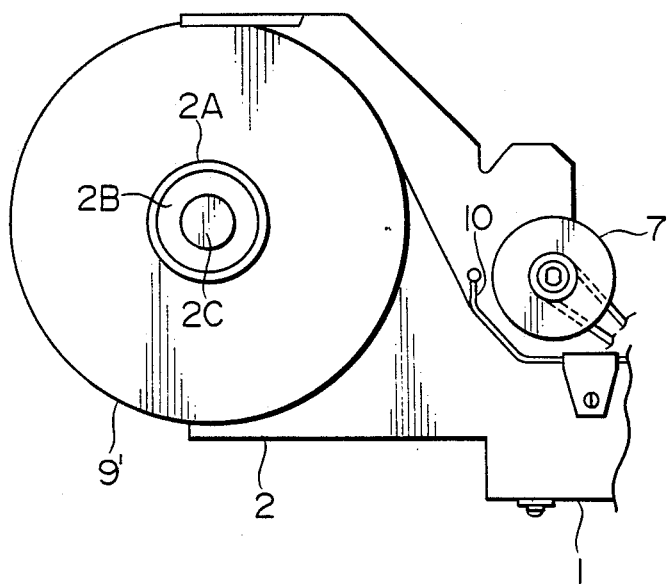
FIG. 8(b)

ELECTRONIC CHIP SUPPLYING APPARATUS AND METHOD

BACKGROUND OF THE INVENTION

The present invention relates to a tape type electronic chip supplying apparatus and a supplying method for supplying fine electronic chips having no lead wire such a chip type resistors, chip type laminated condenser or the like to a chip mounter or an electronic circuit board.

Electronic chips of this type are shown in Japanese Patent Unexamined Publication No. 60-24100. According to such a conventional technique, electronic chips are, respectively, inserted into and retained in recesses arranged in a longitudinal direction of a tape (retainer tape) made of paper, for example. In this case, the chips are kept in the recesses in a sealed state by detachably attaching a coating tape onto a top surface of the retainer tape. The retainer tape in which the electronic chips are sealed in the recesses is rolled around a reel in the supply apparatus. The retainer tape is intermittently withdrawn and supplied from the roll at a pitch corresponding to a distance between the adjacent recesses by intermittent rotation of a sprocket which is engaged with perforations formed along a side edge of the retainer tape. When the chip is delivered to an opening position where the chip is to be picked up in the suppy apparatus, the coating tape is peeled away from the paper tape, and then the exposed chip is sucked by a vacuum absorption nozzle of the chip mounter. Thus, the chip is picked up from the recess of the retainer tape. In the thus constructed electronic chip supplying apparatus, if a tape delivery speed, i.e., chip feeding pace would be increased to a high level or the retainer tape fluctuates up and down; there would be generated a phenomenon in which the electronic chip would rattle or jump at the opening position. As a result, the electronic chip would jump out of the recess of the retainer tape or the chip to be picked up would be offset relative to the vacuum absorption nozzle of the chip mounter thereby resulting in a failure in the pickup operation.

SUMMARY OF THE INVENTION

An object of the invention is to provide an electronic chip supplying apparatus of this type, which suppresses the generation of the "jumping" or rattling phenomenon of a chip and ensures the supply of the chip to a chip mounter.

Another object of the invention is to provide an electronic chip supplying apparatus and a supply method for suppressing the vertical fluctuation of the retainer tape to thereby prevent the jump phenomenon of the chip.

In order to attain these and other objects, according to the present invention, there is provided an electronic chip supplying apparatus comprising, guide means for guiding a retainer tape to an opening position where electronic chips are to be picked up by a chip pickup means, with the electronic chips being encased in recesses formed along a longitudinal direction of the retainer tape. The recesses are sealed by attaching a detachable coating tape onto a top surface of the retainer tape intermittent driving means intermittently pull under traction, the retainer tape of a position downstream of the opening position. Peeling means are provided for peeling the coating tape away from the retainer tape at the opening position and, tape support means are provided for supporting the retainer tape at the opening position, as well as suppressing means for suppressing vertical fluctuation of the retainer tape at the opening position.

Another aspect of the present invention, there is provided an electronic chip supplying apparatus comprising guide means for guiding a retainer tape, which encases electronic chips, to an opening position where a chip pickup means is located; intermittent driving means intermittently pull; under traction, the retainer tape, with peeling means peeling a coating tape away from the retainer tape at the opening position, and tape support means supporting the retainer tape at the opening position. The tape support means having an opening portion opened toward the retainer tape and a vacant chamber which is kept under vacuum pressure.

According to still another aspect of the invention, there is provided an electronic chip supplying apparatus comprising guide means for guiding a retainer tape, which encases electronic chips, to an opening position where a chip pickup means of a chip mounter is located. Peeling means are provided for peeling a coating tape away from the retainer tape at the opening position, with tape support means supporting the retainer tape at the opening position and means imparting a predetermined tension to the retainer tape at the opening position.

According to the invention, there is provided an electronic chip supplying method comprising the steps of: intermittently moving a retainer tape, which encases therein electronic chips, to a chip pickup position; simultaneously with the intermittently moving step, sucking the retainer tape at the chip pickup position toward a tape support means; peeling a coating tape from the retainer tape at the chip pickup position; and after the peeling step, picking up the chips away from the retainer tape.

According to another aspect of the invention, there is provided an electronic chip supplying method comprising the steps of: intermittently moving a retainer tape, which encases therein electronic chips, to a chip pickup position; imparting a predetermined tension to the retainer tape at the chip pickup position, the imparting step being performed simultaneously with the intermittently moving step; peeling a coating tape away from the retainer tape; and picking up the chips from the retainer tape.

With such features, when the retainer tape is delivered to the opening position, the retainer tape is attracted under vacuum pressure against the tape support member and is held in contact with the tape support member to eliminate a gap between the retainer tape and the tape support member. Thus, it is possible to prevent a vertical fluctuation of the retainer tape to eliminate the "jump" phenomenon of the electronic chips.

Also, by imparting tension to the tape, it is possible to suppress the vertical vibration of the tape and to suppress the jump phenomenon of the electronic chips in the same manner.

BRIEF DESCRIPTION OF THE DRAWINGS

In the accompanying drawings:

FIG. 7 is a partial side elevational view showing an example of the means for imparting the tension to the tape;

FIGS. 8(a) and 8(b) are a front view and a side elevational view showing another example of the means for imparting the tension to the tape.

DESCRIPTION OF THE PREFERRED EMBODIMENTS

Figures 1, 2, 3:
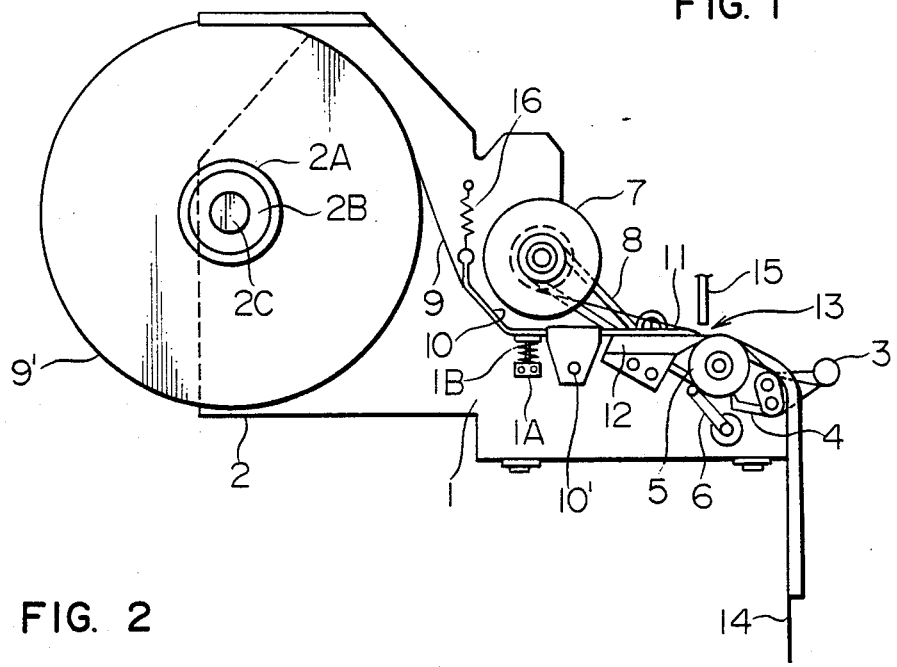
FIG. 1 is a side elevational view showing an entire structure of an electronic chip supplying apparatus according to an embodiment of the invention.
FIG. 2 is a perspective view showing the vicinity of the tape support member shown in FIG. 1.
FIGS. 3 and 4 are a side elevational view and a top plan view, respectively, of an example of the tape support member according to the invention.

Referring now to the drawings wherein like reference numerals are used throughout the various views to designate like parts and, more particularly, to FIG. 1, according to this figure, a supply apparatus comprises a supply apparatus body 1, a stationary cover 2 secured to the body 1 for mounting a reel 9' for a electronic chip sealing paper tape (retainer tape) 9, a lever 3 pivotally mounted on the body 1 and pivotable in symchronism with the operation of a chip mounter (not shown), a sprocket drive claw 4 supported by the vibration lever 3, a sprocket 5 pivotally mounted on the body 1 and intermittently rotated by the claw 4, a reverse rotation preventing member 6 for the sprocket 5, a coating tape winding reel 7 pivoted to the body 1 and a transmission belt 8 laid between the sprocket 5 and the reel 7. A tape guide plate ten guides the retainer tape 9 toward an opening position generally designated by the reference numeral 13, and a tape retainer plate 11 is formed integrally with the tape guide plate 10 and is subjected to a rotational force around a pivot 10' by a spring 16 so that the tape retainer plate 11 is depressed against a tape support member 12 which is mounted on the body 1. In opening position 13, the electronic chip is picked up by a vacuum suction nozzle 15 forming the chip pick-up means. The opening position 13 is located on the tape support member 12 which, as described more fully hereinbelow, includes an open vacant chamber 12A maintained undera vacuum pressure so as to expose the retaining tape to the vacuum in the vacant chamber 12A. Reference numeral 14 denotes a tape from which the chip has been removed.

The electronic chips are received one by one in recesses formed along the longitudinal direction in the paper tape. A coating tape is detachably attached to a top surface of the paper tape to seal the electronic chips in the recesses. The thus processed retainer tape 9 is wound around the reel 9' which is supported rotatably by the stationary cover 2. The retainer tape 9 withdrawn from the reel 9' is adapted to extend along the bottom surface of the tape guide plate 10 and pass through a space between the tape retainer plate 11 and the tape support member 12 while the perforation along the side edge of the retainer tape 9 is engaged with the sprocket 5. When the lever 3 is pivoted in synchronism with the operation of the chip mounter (not shown,) the sprocket 5 is intermittently rotated in the clockwise direction in FIG. 1 by the drive claw 4 that is in resilient contact with the sprocket 5. As a result, the retainer tape 9 is intermittently delivered under traction in the rightward direction in FIG. 1 at a pitch corresponding to a distance between the adjacent recesses of the retainer tape 9. The coating tape attached to the retainer tape 9 is peeled at the rightward end of the tape retainer plate 11 in the opening position 13. The thus peeled coating tape is wound around the take-up reel 7 that is operated synchronously with the sprocket 5 through the belt 8. Thus, the coating tape is peeled off so that the chips received in the recesses of the retainer tape 9 are exposed in the opening position 13 and are sucked under vacuum by the vacuum suction nozzle 15 of the chip mounter that has been lowered to the opening position. Then, the chips are picked up one by one from the recesses of the retainer tape 9. Thereafter, the chips are mounted on the electronic circuit board (not shown). The retainer tape 14 from which the chips have been removed is disposed while being cut in a suitable length.

FIG. 2 is a perspective view schematically showing the vicinity of the tape support member 12 shown in FIG. 1. In the chip supplying apparatus of this type, there is a fear that the retainer tape 9 intermittently supplied would fluctuate up and down due to the peeling operation of the coating tape 9a at the opening position 13 so that the chips 19 would jumped out of the tape recesses or the positional offset would occur so that the chips 19 would not be sucked effectively by the vacuum suction nozzle 15 of the chip mounter. The above-mentioned vertical fluctuation of the tape 9 could not be sufficiently suppressed by the tape retainer plate 11, because, even if the tape retainer plate 11 would cause the tape 9 to be suppressed against the tape support member 12, it would be difficult to completely depress the tape 9 against the tape support member 12.

An object of the invention is to prevent the vertical fluctuation of the tape at the opening position 13 and to suppress the "jump" phenomenon of the chips 19 caused by the vertical fluctuation. For this purpose, as shown in FIG. 3, an upwardly opened vacant chamber 12A is formed in the tape support member 12, and this chamber 12a may be kept in a vacuum condition by a tube 12B connected to one end of the vacant chamber 12A.

Figure 4:
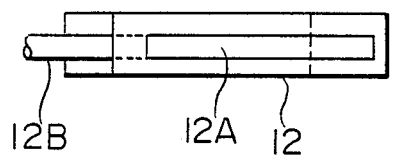

Since, as shown in FIG. 4, the vacant chamber 12A is kept under the vacuum condition through the tube 12B, when the tape 9 is fed above the tape support member 12, the tape 9 is sucked under the vacuum pressure in contact with the top surface of the tape support member 12 to eliminate a gap between the tape and the top surface, thus preventing the vertical vibration of the tape at the opening position 13. As a result, the electronic chips 19 are positively taken out by the vacuum suction nozzle 15 of the chip mounter without the jump phenomenon.

Figure 5:
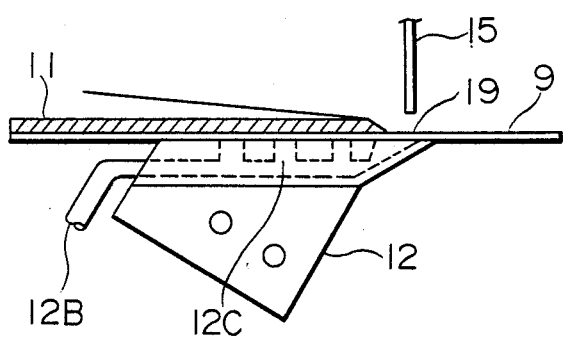
FIGS. 5 and 6 are a side elevational view and a top plan view, respectively, of another example of the tape support member according to the invention.
Figure 6:
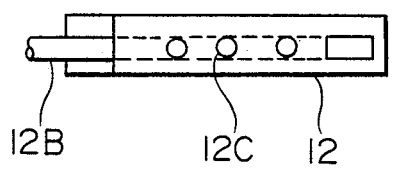

As shown in FIGS. 5 and 6, the vacant chamber has a plurality of upwardly opened apertures 12C formed in the tape support member 12. The vacant chamber 12 is sucked through the tube 12B. According to this example, the same effect as that of the foregoing embodiment may be ensured.

Also, it has been found that it is possible to suppress the jump phenomenon of the electronic chips at the opening position 13 by imparting a suitable tension to the retainer tape. An example of means for imparting the tension to the tape will now be described with reference to FIGS. 1 and 7. Namely, a spring retainer 1A is fixed to the body 1, and a contact plate 1C is brought into contact with a bottom surface of the tape guide plate 10 by a spring 1B retained by the spring retainer 1A. The tape 9 is adapted to pass through a space between the guide plate 10 and the contact plate 1C. Thus, the tape 9 is withdrawn by the sprocket 5 while being subjected to a frictional force caused by the contact force of the spring 1B so that a tension is imparted to the tape 9.

Another example of the means for imparting the tension to the tape will now be described with reference to FIGS. 1, 8(a) and 8(b). As shown in these figures, a washer 2A and a disc-like spring 2B are provided around a shaft 20 by which the reel 9' of the tape 9 is rotatably supported. The friction is imparted against the rotation of the reel 9' by pressing the washer 2A and the disc-like spring 2B by a retainer screw 2C. When the tape to be fed by the rotation of the reel 9' is withdrawn by the sprocket 5, the tape is subjected to the tension due to the above-described friction.

Figure 9:
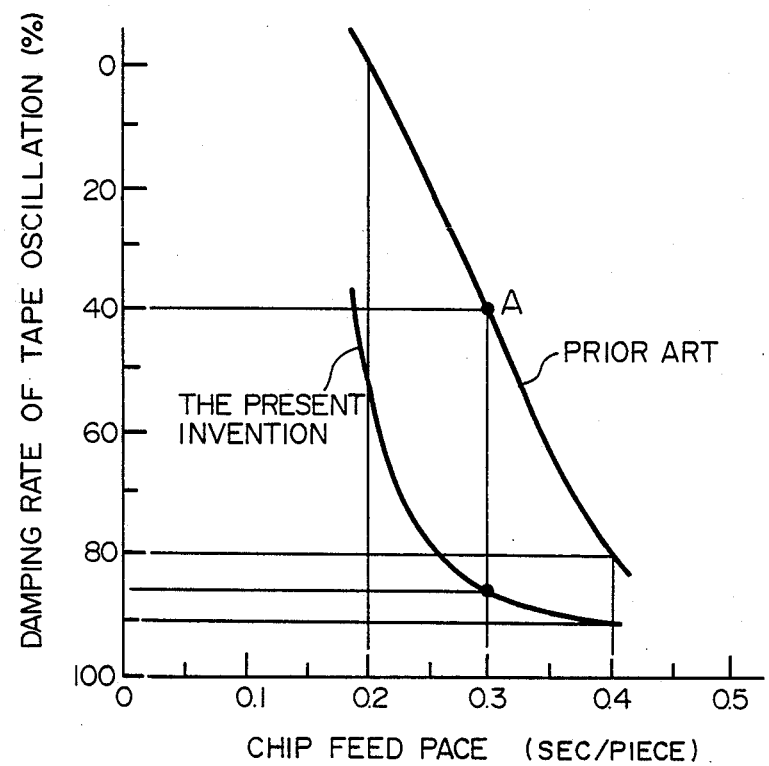
FIG. 9 is a graphical illustration showing the comparison results between the prior art and the present invention in which the tension is applied to the tape.

The effect in the case where the means for imparting the tension to the tape 9 is provided as shown in FIGS. 7, 8(a) and 8(b) will now be described with reference to FIG. 9 in which the ordinate indicates the damping rate of the tape oscillation, whereas, the abscissa indicates the chip feed interval. The measurement position of the tape oscillation was at the electronic chip opening position 13. In FIG. 9, the tape shift when the chips completely jump out is expressed by a damping rate 0%. In the chip supplying apparatus according to the prior art, when the chip feed pace was varied from 0.2 sec/piece to 0.4 sec/piece, the damping rate of the tape oscillation was in the range of 0% to 80%. On the other hand, in the case where the means for applying the tension to the tape was provided according to the invention, the damping rate of the tape was in the ranged of 50 to 90% in the range from the chip feed pace of 0.2 sec/piece to the chip feed pace of 0.4 sec/piece. In the case where the chip feed pace was selected at 0.3 sec/piece, in comparison between point A of the conventional structure and point B of the present invention, the damping rate according to the conventionsl structure was at 40%, whereas, the damping rate according to the invention was at 85%. Thus, according to the invention, the tape oscillation was damped beyond a level twice greater than that of the conventional structure. As is apparent from the above-described results, it is appreciated that, according to the invention, it is possible to reduce the tape oscillation to thereby suppress the jumping phenomenon of the electronic chips during the tape travel.

As described above, according to the present invention, even if the feed pace of the chips that are delivered by the tape is higher than that of the conventional system, it is possible to suppress the vertical vibration of the tape at the opening position where the chips are to be picked up, and to suppress the jump phenomenon of the electronic chips. Thus, it is possible to prevent the jump out of the chips from the recesses and the positional offset. It is therefore possible to ensure the supplying operation of the chips to the chip mounter and to enhance the supply efficiency.

What is claimed is:

1. An electronic chip supplying apparatus comprising:
    guide means for guiding a retainer tape to an opening position where electronic chips are to be picked up by a chip pickup means, said electronic chips being encased in recesses arranged along a longitudinal direction of said retainer tape, and said recesses being sealed by attaching a detachable coating tape onto a top surface of said retainer tape;
    intermittent driving means for intermittently pulling under traction said retainer tape at a position downstream of said opening position;
    peeling means for peeling said coating tape away from said retainer tape at said opening position;
    tape support means for supporting said retainer tape at said opening position including vacant chamber means maintained undera vacuum pressure, an aperture means communicating with said vacant chamber means and opening toward said retainer tape; and
    suppressing means for suppressing vertical fluctuation of said retainer tape at said opening position, said suppressing means includes said tape support means.

2. An electronic chip supplying apparatus comprising:
    guide means for guiding a retainer tape, which encases electronic chips, to an opening position where a chip pickup means is located;
    intermittent driving means for intermittently pulling under traction said retainer tape;
    peeling means for peeling a coating tape away from the retainer tape at said opening position; and
    tape support means for supporting said retainer tape at said opening position; said tape support means including a vacant chamber means maintained under vacuum pressure, and aperture means communicating with the vacant chamber means and opening toward said retainer tape.

3. An electronic chip supplying apparatus comprising:
    guide means for guiding a retainer tape which encases electronic chips;
    means for moving said retainer tape;
    means for peeling a coating tape away from said retainer tape; and
    tape support means for supporting said retainer tape at an opening position where a chip pickup means is located, said tape support means including a vacant chamber means maintained under vacuum pressure, and aperture means communicating with the vacant chamber means and opening towards said retainer tape.

4. An electronic chip supplying apparatus according to claim 3, further comprising means for imparting a predetermined tension to said retainer tape at a position where said chip pickup means is located.

5. A retainer tape support member for supporting a retainer tape that encases therein electronic chips at an opening position where a chip pickup means of an electronic chip supplying apparatus is located, the retainer tape support member comprising:
    a vacant chamber means maintained under vacuum pressure; and
    aperture means communicating with the vacant chamber means and opening toward a retainer tape means so as to apply a vacuum pressure on the retainer tape.

6. An electronic chip supplying method comprising the following steps of:
    intermittently moving a retainer tape, which encases therein electronic chips, to a chip pickup position;
    sucking said retainer tape at said chip pickup position toward a tape support means, said sucking step being performed simultaneously with said intermittently moving step;
    peeling a coating tape from said retainer tape at said chip pickup position; and
    after said peeling step, picking up said chips away from said retainer step.

* * * * *